United States Patent
Kishino et al.

(10) Patent No.: US 8,199,520 B2
(45) Date of Patent: Jun. 12, 2012

(54) TERMINAL HAVING BUS BAR

(75) Inventors: Noriya Kishino, Shioya-gun (JP); Jin Kurihara, Shioya-gun (JP)

(73) Assignee: Keihin Corporation, Tokyo (JP)

( * ) Notice: Subject to any disclaimer, the term of this patent is extended or adjusted under 35 U.S.C. 154(b) by 410 days.

(21) Appl. No.: 12/508,790

(22) Filed: Jul. 24, 2009

(65) Prior Publication Data
US 2010/0020516 A1  Jan. 28, 2010

(30) Foreign Application Priority Data
Jul. 28, 2008  (JP) .................................. 2008-193422

(51) Int. Cl.
*H01R 9/00* (2006.01)

(52) U.S. Cl. ........ 361/775; 361/611; 361/637; 361/648; 361/651; 361/803; 174/50.52; 174/68.2; 439/949; 439/908

(58) Field of Classification Search ............ 174/50, 174/50.52, 50.56, 50.6, 68.2; 361/611, 637–639, 361/648–651, 658, 803, 772, 775, 776; 439/949, 439/908
See application file for complete search history.

(56) References Cited

U.S. PATENT DOCUMENTS

| | | | | |
|---|---|---|---|---|
| 5,183,405 A * | 2/1993 | Elicker et al. ................. | 439/108 |
| 6,244,877 B1 * | 6/2001 | Asao ............................ | 439/76.2 |
| 6,836,108 B1 * | 12/2004 | Balko et al. .................... | 324/142 |
| 7,104,810 B2 * | 9/2006 | Kawakita et al. ............. | 439/76.2 |
| 7,158,372 B2 * | 1/2007 | Sanada et al. .................. | 361/752 |
| 7,656,016 B2 * | 2/2010 | Yoshimatsu et al. .......... | 257/686 |
| 7,983,024 B2 * | 7/2011 | Harris, IV ..................... | 361/629 |
| 2001/0003070 A1 * | 6/2001 | Asao ............................ | 439/76.2 |
| 2003/0045137 A1 * | 3/2003 | Yamane et al. ................ | 439/76.2 |
| 2005/0094356 A1 * | 5/2005 | Onizuka et al. ................ | 361/611 |
| 2009/0257211 A1 * | 10/2009 | Kontani et al. ................ | 361/782 |

FOREIGN PATENT DOCUMENTS

JP  2002119068 A  4/2002

* cited by examiner

*Primary Examiner* — Hoa C Nguyen
(74) *Attorney, Agent, or Firm* — Westerman, Hattori, Daniels & Adrian, LLP

(57) ABSTRACT

A terminal is provided with a support portion configured to be mounted on a circuit board and having electrical insulation property, and a bus bar supported on the support portion and having electrically conductive property. The bus bar includes an external connecting portion configured to be electrically connected to external equipment, a first connecting portion configured to be electrically connected to the circuit board, and a second connecting portion configured to be electrically connected to another circuit board spaced from the circuit board, without passing through the circuit board.

6 Claims, 7 Drawing Sheets

US 8,199,520 B2

TERMINAL HAVING BUS BAR

BACKGROUND OF THE INVENTION

The present invention relates to a terminal having a bus bar, and particularly to a terminal having a bus bar supported on a support portion made of resin.

An inverter device has been used for controlling external equipments such as a motor and takes the form of a structure in which semiconductor devices such as insulation gate bipolar transistors are mounted on an electronic circuit board. In addition, the inverter device has the structure to allow an external power source to supply electric power to the semiconductor devices using terminals having bus bars made of metallic plates or the like while enabling signals to be input or output.

Here, Japanese Patent Application Laid-Open Publication No. 2002-119068 relates to an inverter device. Specifically, when electric power is to be supplied to the electronic circuit board and a control board in the inverter device, a P-terminal and an N-terminal, connected to a two-phase DC power supply, are used to supply a direct current to a plurality of transistors mounted on the electronic circuit board.

Further, wirings connected to the respective transistors from the P-terminal are bifurcated to other wirings, which are connected to pin terminals for external connections. The pin terminals are connected to the control board via multicore cables so as to allow a voltage which is applied to the P-terminal as a high direct current voltage, to be supplied to the control board via the bifurcated wirings, the pin terminals and the multicore cables to permit the operation of the circuit board in use.

SUMMARY OF THE INVENTION

However, according to several studies conducted by the present inventors of the present invention, in such a structure, additional wiring patterns with the bifurcated wirings are to be formed on the electronic circuit board to allow electric power to be supplied to the control board via the electronic circuit board, and this causes resultant limitations in layout of wirings and component parts.

Moreover, such additional wiring patterns require additional power-supply pin terminals and power-supply cables, and this increases the number of component parts and man-hour requirement.

After such studies conducted by the present inventors, the present invention has been completed, and an object of the present invention is to provide a terminal having a bus bar applicable to an electronic controlling device such as an inverter device and capable of supplying electric power to two electric boards with a simple structure while omitting additional wiring patterns with bifurcated wirings to reduce the number of component parts and man-hour requirement.

In one aspect of the present invention, a terminal is provided with a support portion configured to be mounted on a circuit board and having electrical insulation property, and a bus bar supported on the support portion and having electrically conductive property. The bus bar includes an external connecting portion configured to be electrically connected to external equipment, a first connecting portion configured to be electrically connected to the circuit board, and a second connecting portion configured to be electrically connected to another circuit board spaced from the circuit board, without passing through the circuit board.

DETAILED DESCRIPTION OF THE PREFERRED EMBODIMENT

An embodiment according to the present invention will be described below in detail, with reference to the accompanying drawings.

Figure 1:
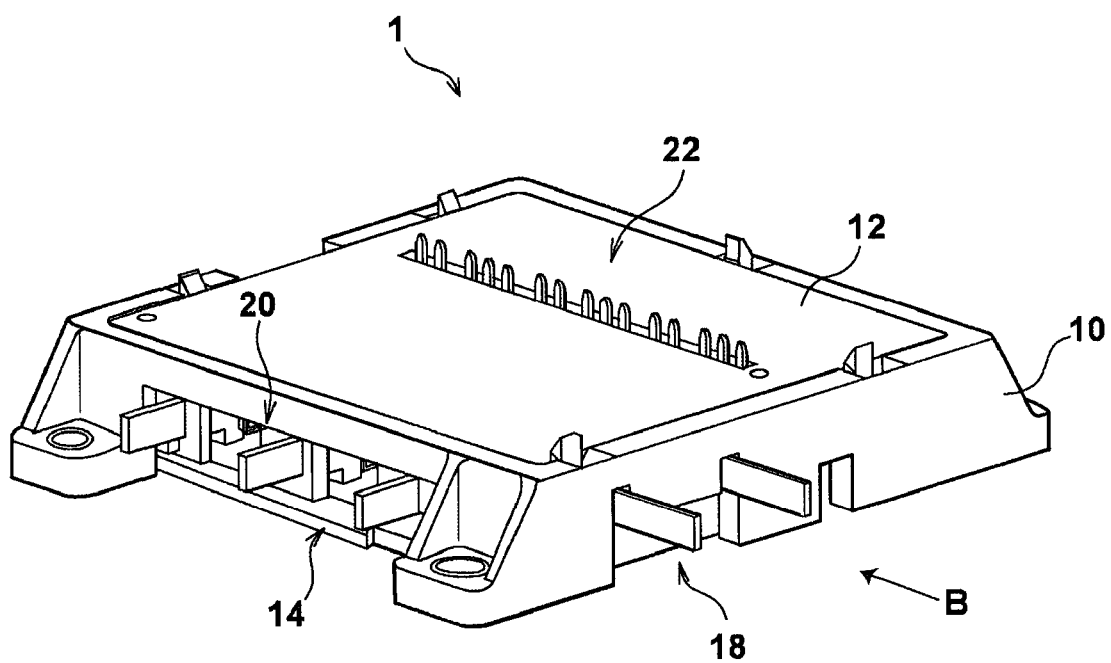
FIG. 1 shows a perspective view of an inverter device having a terminal of an embodiment according to the present invention.
Figure 1:
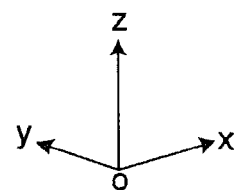
Figure 2:
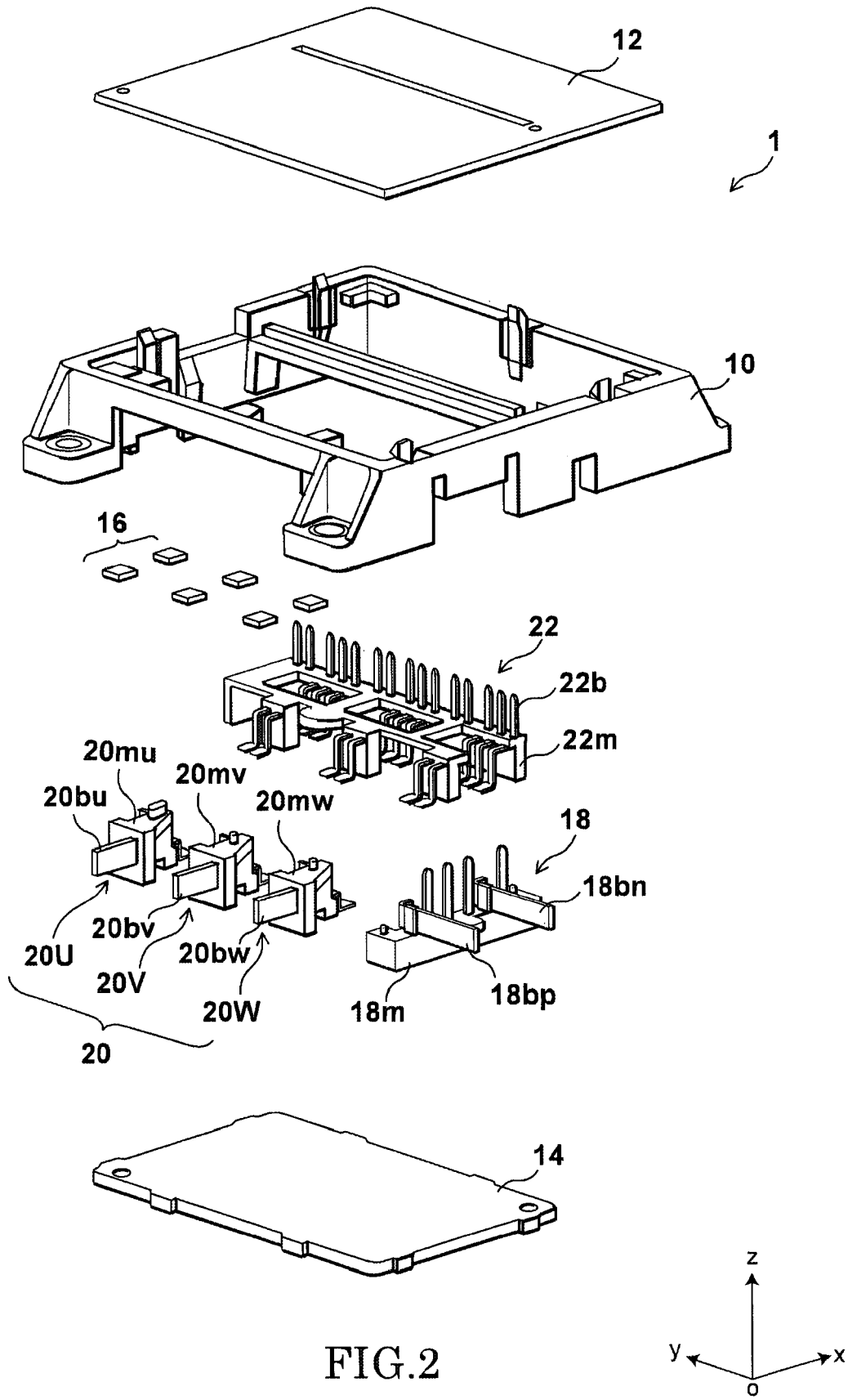
FIG. 2 shows an exploded perspective view of the inverter device of the present embodiment.

FIGS. 1 and 2 show a structure of an inverter device as one example of a semiconductor device of the present embodiment. The inverter device 1 has a case 10, made of resin, on which a control board 12 is fixedly mounted and in which an electronic circuit board 14 is accommodated. Though not shown, the case 10 is fixedly secured to a radiator member, made of metal or the like, by means of fixing members such as bolts or the like.

Though not shown, the electronic circuit board 14 has on one surface, facing an inside of the case 10, which is formed with circuit patterns each made of electrically conductive material, such as gold or the like, and which mounts thereon semiconductor devices 16 composed of insulated gate bipolar transistors, respectively. Though not shown, the semiconductor devices 16 are bonded to conductive pads formed on the electronic circuit board 14. In addition, the semiconductor devices 16 are construed not to be limited to the insulated gate bipolar transistors, respectively.

Further, the electronic circuit board 14 mounts thereon, in addition to the semiconductor devices 16, an input terminal 18, an output terminal 20 and a relay terminal 22. The input terminal 18 has two terminal elements in the form of a P-terminal and an N-terminal. These terminal elements are connectable to an input DC (direct current) power source via a smoothing capacitor provided for the semiconductor devices 16 to stably operate. Furthermore, the output terminal 20 has three terminal elements in the form of a U-phase terminal 20U, a V-phase terminal 20V and a W-phase terminal 20W for a three-phase AC (alternate current). Moreover, the three-phase AC is output from the semiconductor devices 16 to be input to loads such as a vehicular motor, an electric compressor and the like, as external equipments. In addition, the relay terminal 22 has a plurality of pins 22b. These plural pins 22b are connected to a controller mounted on the control board 12 for controlling operations of the semiconductor devices 16. The smoothing capacitor, the input power source, the loads such as the vehicular motor and the controller are not shown in the drawings for convenience of descriptions.

Here, the input terminal 18 includes a resin portion 18*m* as a support portion having electrical insulation property. Further, the resin portion 18*m* is provided with a bus bar 18*bp*, used as a P-terminal, and a bus bar 18*bn* used as an N-terminal, both of which are insertion molded to the resin portion 18*m*. The bus bars 18*bp* and 18*bn* partially protrude from the resin portion 18*m*.

Furthermore, the U-phase terminal 20U of the output terminal 20 includes a resin portion 20*mu* as a support portion having electrical insulation property, which supports a bus bar 20*bu* partially extending from the resin portion 20*mu*.

The V-phase terminal 20V of the output terminal 20 includes a resin portion 20*mv* as a support portion having electrical insulation property, which supports a bus bar 20*bv* partially extending from the resin portion 20*mv*.

The W-phase terminal 20W of the output terminal 20 includes a resin portion 20*mw* as a support portion having electrical insulation property, which supports a bus bar 20*bw* partially extending from the resin portion 20*mw*.

Further, the relay terminal 22 includes a resin portion 22*m* as a support portion having electrical insulation property, which supports a plurality of pins 22*b* partially extending from the resin portion 22*m*.

Specifically, the resin portion 18*m* of the input terminal 18 is divided on the electronic circuit board 14 to be separate from the other such that the input terminal 18 is comprised of a separated module on the electronic circuit board 14 to be spatially independent from the other. Likewise, the resin portion 20*mu* of the U-phase terminal 20U, the resin portion 20*mv* of the V-phase terminal 20V, the resin portion 20*mw* of the W-phase terminal 20W and the resin portion 22*m* of the relay terminal 22 are separate from the other on the electronic circuit board 14. Thus, the U-phase terminal 20U, the V-phase terminal 20V, the W-phase terminal 20W and the relay terminal 22 are divided on the electronic circuit board 14 to be separate from the other such that each of them is comprised of a separated module on the electronic circuit board 14 to be spatially independent from the other.

Here, a structure of a terminal, having bus bars, of the present embodiment will be described below in detail, with reference to FIGS. 3 to 6.

In the input terminal 18, two bus bars 18*bp* and 18*bn* extend from the resin portion 18*m* having electrical insulation property for supply of electric power. Further, the resin portion 18*m* is provided with two signal lead pins 18*ba* and 18*bb* that are supported between the bus bars 18*bp* and 18*bn* by the resin portion 18*m*.

Figure 3:
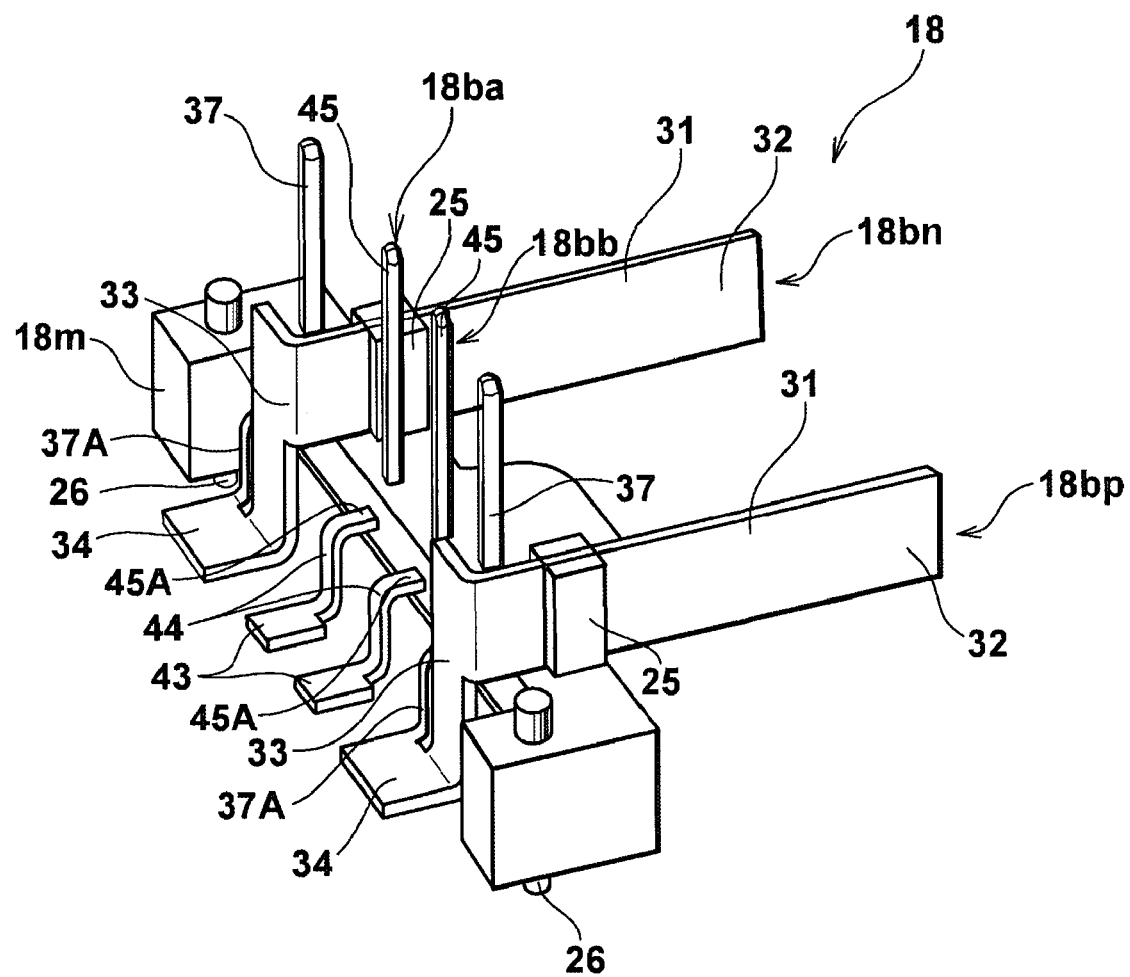
FIG. 3 shows a perspective view of the terminal in the inverter device of the present embodiment.
Figure 4:
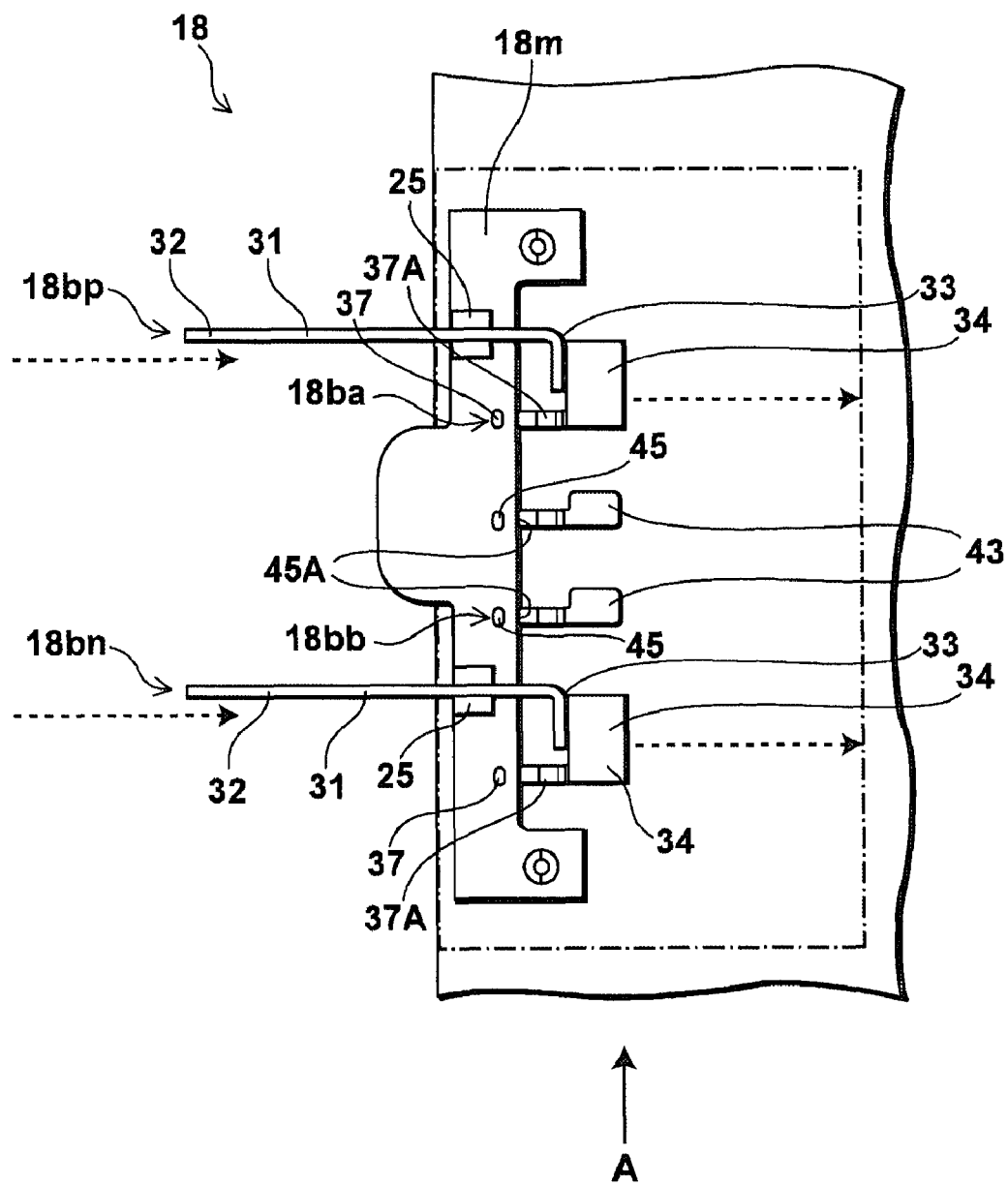
FIG. 4 shows a partial plan view of the terminal in the inverter device of the present embodiment.
Figure 6:
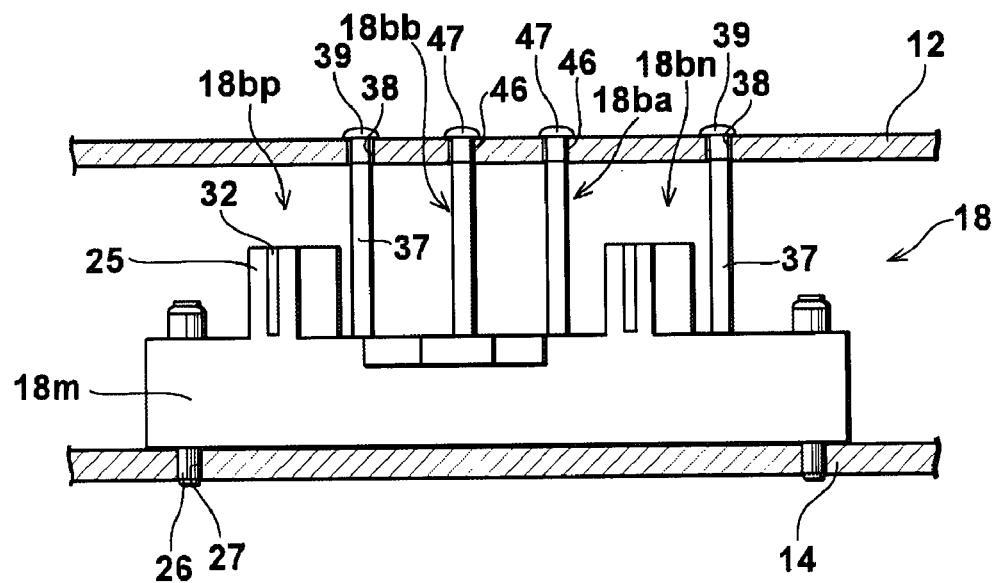
FIG. 6 is a schematic view showing a connecting structure and a location between the terminal and a control board of the inverter device of the present embodiment.

As shown in FIGS. 3 and 4, the resin portion 18*m* has an upper surface from which two holder segments 25 protrude upward and the bus pars 18*bp* and 18*bn* are fixedly supported by the holder segments 25 one by one. In addition, the resin portion 18*m* has a lower portion formed with a pair of protrusions 26 to put the holder segments 25 between the pair of protrusions 26. The protrusions 26 are inserted to through-holes 27 formed in the electronic circuit board 14 as shown in FIG. 6 to preclude the resin portion 18*m* from moving on in the electronic circuit board 14.

The bus bars 18*bp* and 18*bn* include bus-bar main bodies 31 fixedly secured the resin portion 18*m* at an upper wall thereof, respectively. The bus-bar main bodies 31 have one end portions formed with external connecting portions 32, which extend outward from the resin portion 18*m* and the electronic circuit board 14. The external connecting portions 32 are connected to external electrodes that are not shown in the drawings.

The bus-bar main bodies 31 have the other end portions formed with bent portions 33, folded downward and subsequently formed with connecting portions 34 serving as first connecting portions, respectively, which are placed on the electronic circuit board 14. The connecting portions 34 are bonded to electrode pads 36, formed on the electronic circuit board 14, by solders 35, respectively.

Figure 5:
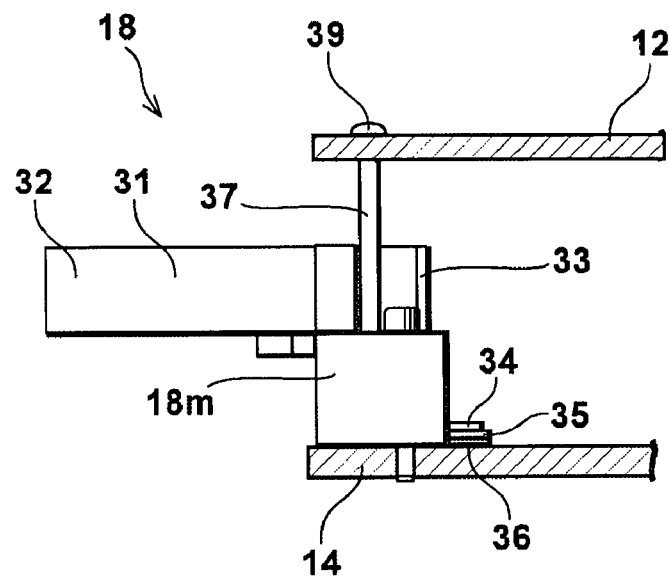
FIG. 5 shows a side view along an arrow A of FIG. 4 of the present embodiment.

Further, one lead pin 37 extends from each of the connecting portions 34 to serve as a second connecting portion. The lead pins 37 are bent at bent portions 37A and pass through the resin portion 18*m* to be vertically extracted upward from the resin portion 18*m* in an approximately vertical direction, respectively. As shown in FIGS. 5 and 6, the lead pins 37 extend through through-holes 38 formed in the control board 12 to be bonded thereto by solders 39. The through-holes 38 are formed in the control board 12 at positions corresponding to the lead pins 37 of the bus bars 18*bp* and 18*bn*, respectively. Two through-holes 38 are formed for supply of electric power and the lead pins 37 are electrically connected to electrically conductive patterns (not shown) of the control board 12 by the solders 39.

In addition, since the lead pins 37 integrally extend from the connecting portions 34, respectively, by mounting surface-mount capacitors on the electronic circuit board 14 at a position in close proximity to the connecting portions 34, the control board 12 can be supplied with signals and electric power in stabilized manner.

The lead pins 18*ba* and 18*bb* have connecting portions 43 bonded to other electrode pads (not shown), formed on the electronic circuit board 14, by soldering, respectively. Also, in upwardly extending portions form the connecting portions 43 have, there are formed with bent portions 44 and lead pins 45 extends upward form the bent portions 44, respectively. As shown in FIG. 6, the lead pins 45 are inserted through through-holes 46 of the control board 12 to be bonded thereto by solders 47.

The through-holes 46 are formed in the control board 12 at positions corresponding to the lead pins 45, respectively. The through-holes 46 are used for exchanging signals between the two boards 12 and 14. The lead pins 45 are electrically connected to electrically conductive patterns (not shown) of the control board 12 by the solders 47. In addition, connecting portions 45A are integrally formed at positions in the vicinity of lower end portions of the lead pins 45 to extend toward the resin portion 18*m*, respectively. The connecting portions 45A are inserted through the resin portion 18*m* to be fixed lead pins 45.

Next, a method of mounting the input terminal 18 will be described below in detail.

The input terminal 18 is mounted on the electronic circuit board 14 in a given position thereof using a mounter that is not shown. Further, other terminals 20 and 22, the semiconductor devices 16 and the like are similarly mounted on the electronic circuit board 14. Subsequently, the electronic circuit board 14, on which such component parts are mounted, is introduced into a reflow furnace in turn for heating to melt the solders on the electronic circuit board 14. Thereafter, the solders are cooled, causing the connecting portions 34 of the input terminal 18 to be bonded to the electronic circuit board 14 by the solders.

Further, the electronic circuit board 14 is fixedly secured to the case 10 and, then, the control board 12 is supported on the case 10. In this moment, the four lead pins 37 and 45 of the input terminal 18 are inserted through the associated through-holes 38 and 46 of the control board 12 one by one. This allows the lead pins 37 and 45 and the conductive patterns (not shown) around the through-holes 38 and 46 to be bonded to each other.

With such an inverter device 1, electric power is supplied to the inverter device 1 via the pair of bus bars 18bp and 18bn of the input terminal 18. More particularly, electric power, input from one of the pair of bus bars 18bp and 18bn, is distributed to the control board 12 and the electronic circuit board 14 via the lead pins 37 and the connecting portions 34, respectively. The lead pins 37 allow electric power to be supplied to semiconductor devices and the like on the control board 12. The connecting portions 34 allow electric power to be supplied to the electronic circuit board 14 for use in operating the semiconductor devices 16 mounted and the like on the electronic circuit board 14. That is, electric power, supplied to the bus bars 18bp and 18bn from the outside, is bifurcated to the connecting portions 34 and the lead pins 37. Thus, electric power can be directly supplied to the control board 12 via the lead pins 37, without intervening wirings in the electronic circuit board 14. Simultaneously, electric power can be directly supplied to the electronic circuit board 14 via the connecting portions 34, without intervening wirings in the control board 12. This allows the semiconductor devices 16, placed on the electronic circuit board 14, to be switched in operation under control of the control board 12, causing a three-phase AC of the U-phase, the V-phase and the W-phase to be output from the output terminal 20, thereby driving the loads.

Further, signals are exchanged between the electronic circuit board 14 and the control board 12 via the lead pins 18ba and 18bb. Such signals may include, for instance, the signals for causing the semiconductor devices 16 to be switched on and off in operation in a manner described above.

With the terminal having the bus bars of the present embodiment, as described above, it becomes possible for one input terminal 18 to supply electric power to the two boards 12 and 14 with no need to use wirings arranged inside boards. Accordingly, the board 12 and 14 can be simplified in structure, thereby ensuring freedom in layout of component parts.

With a structure of the type in which, for instance, electric power is supplied to a control board via an electronic circuit board, a need arises for the electronic circuit board to have wiring patterns formed for the control board with resultant limitations in layout of wirings and component parts. Moreover, the structure of the related art needs to have power-supply pin terminals and power-supply cables, resulting in a tendency of causing increased number of components and increased man-hour requirement for production. On the contrary, with the present embodiment, it becomes possible for one terminal to supply electric power and signals to a plurality of boards. Therefore, no need arises for wirings and terminals to be provided on one of the boards to cause electric power and signals, once supplied to the one of the boards as done in the related art, to be bifurcated to the other one of the boards. The power-supply cables can be dispensed with, thereby achieving a reduction in the number of component parts while realizing a reduction in man-hour requirement for assembly. Also, no need arises for connecting the two boards with the use of wirings and cables, resulting in improved reliability.

Adopting the terminal with such bus bars enables the realization of the inverter device 1 with high reliability at low cost.

Figure 7:
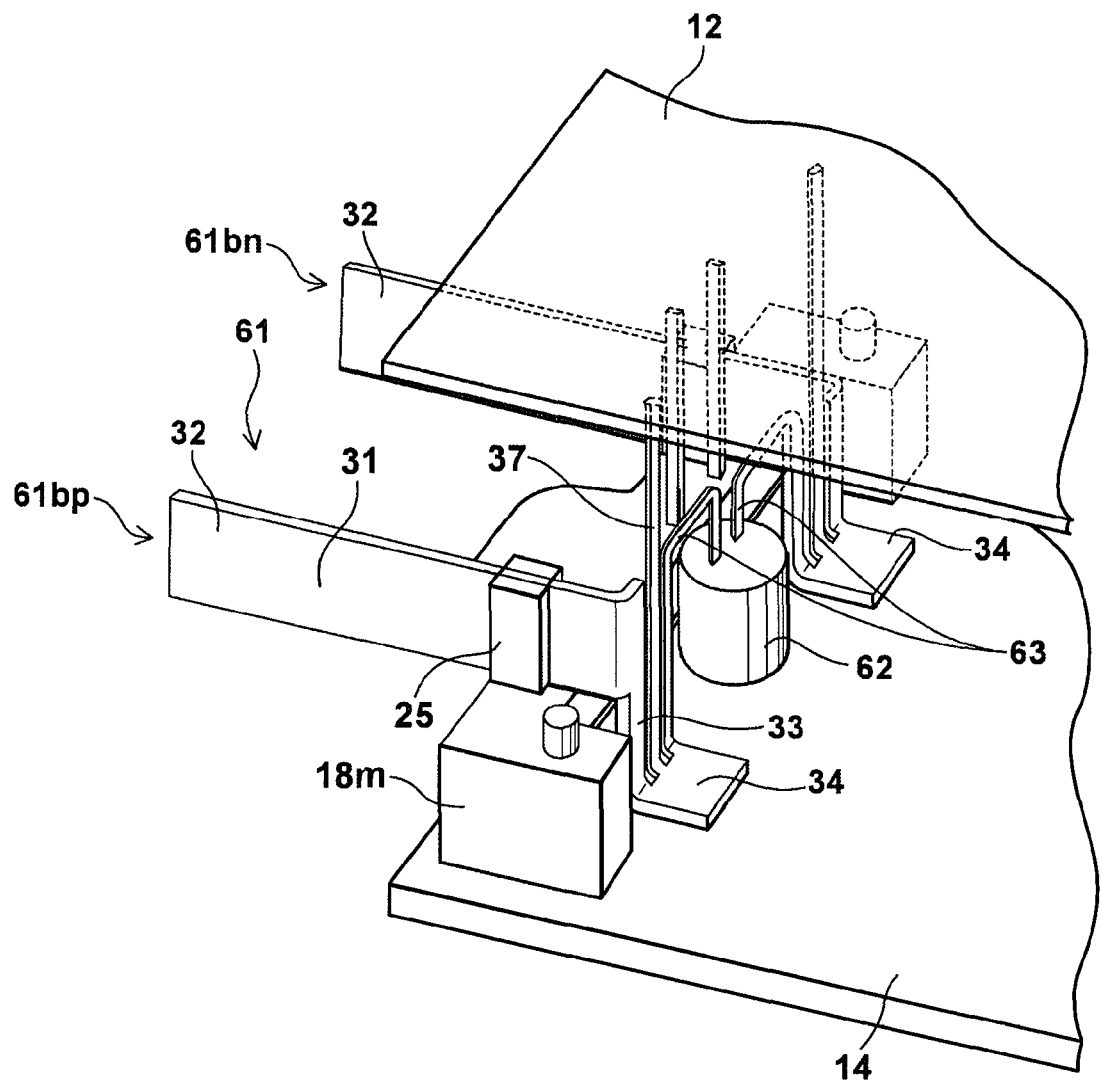
FIG. 7 shows a partially perspective view of a terminal in an inverter device of a modified example of the present embodiment.
Figure 8:
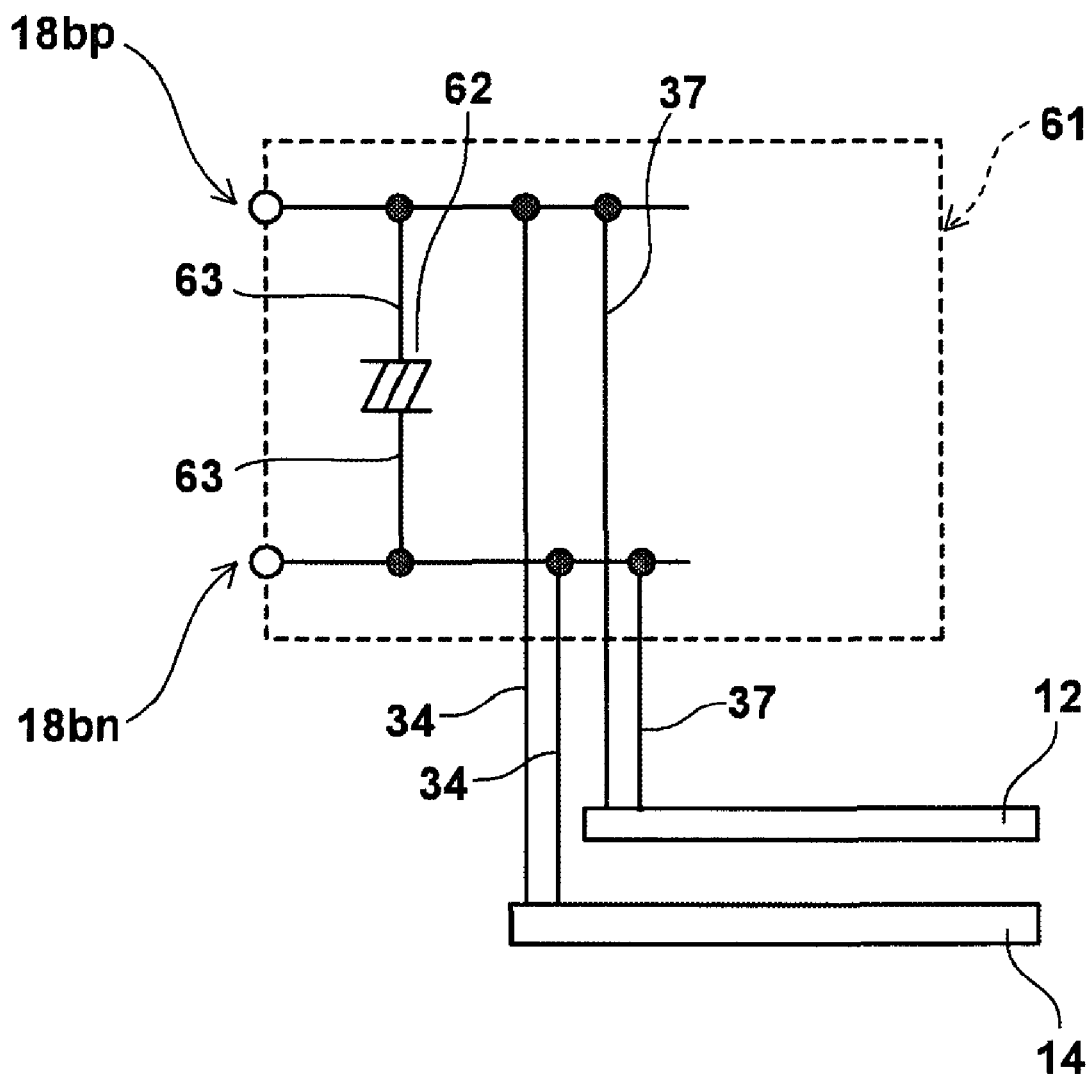
FIG. 8 shows a schematic circuit diagram of the modified example.

A modified example of the present embodiment will be described below in detail, with reference to FIGS. 7 and 8.

An input terminal 61 has a structure in which a pair of bus bars 61bn and 61bp is supported on a resin portion 18m. The bus bars 61bn and 61bp have shapes symmetric with each other with respect a center axis of the input terminal 61. The bus-bar main bodies 31 have one end portions extending outward from the electronic control board 14 to form the external connecting portions 32, respectively. Other end portions of the bus-bar main bodies 31 extend through the bent portions 33 to the connecting portions 34, respectively. The lead pins 37, extending upward to the control board 12, and leads 63 are integrally formed with each other so as to extend from the connecting portions 34, respectively. The leads 63 are connected to a capacitor 62 located in an area between the pair of bus bars 61bn and 61bp.

With such an input terminal 61, the capacitor 62 smoothes fluctuations in electric power applied to the pair of bus bars 61bn and 61bp, upon which smoothed electric power is supplied to the electronic circuit board 14 and the control board 12. Then, with such a situation, electric power, supplied to the bus bars 61bn and 61bp from the outside, is bifurcated to the connecting portions 34 and the lead pins 37. As a result, electric power can be directly supplied to the control board 12 without intervening wirings in the electronic circuit board 14 via the lead pins 37. Likewise, electric power can be directly supplied to the electronic circuit board 14 without intervening wirings in the control board 12 via the connecting portions 34.

In addition, the present invention is not limited to the present embodiments mentioned above and has wide applications.

For instance, the input terminal 18 may allow the pair of bus bars 18bn and 18bp to be used for signal inputs. In this case, signals applied to the bus bars 18bn and 18bp pass through the connecting portions 34 to be input to the electronic circuit board 14. Furthermore, the signals are also applied to the control board 12 via the lead pins 37. That is, the signals applied to the bus bars 18bn and 18bp from the outside are bifurcated to the connecting portions 34 and the lead pins 37. Thus, the signals are directly applied to the control board 12 via the lead pins 37, without passing through the electronic circuit board 14. Similarly, the signals are directly applied to the electronic circuit board 14 via the connecting portions 34, without passing through the control board 12.

Similarly, the pair of bus bars 18bn and 18bp may be used for signal outputs. That is, the terminals 18 and 61 may be used as output terminals, respectively.

Further, with the input terminals 18 and 61, the number of bus bars and locations thereof are construed not to be limited to those of the embodiments. The lead pins 37, serving as the second connecting portions, may be arranged to extend upward directly from the external connecting portions 32, respectively. That is, the connecting portions 34 and the lead pins 37 may be bifurcated from the external connecting portions 32, respectively.

Reference is hereby made to a Patent Application No. TOKUGAN 2008-193422 with a filing date of Jul. 28, 2008 in Japan, the entire content of which is incorporated herein by reference.

In addition, it is needless to say that such structural elements of the present invention can be replaced with those having equivalent operations and effects within the gist of the present invention. The scope of the invention is defined with reference to the following claims.

What is claimed is:

1. A terminal, comprising:
   a support portion configured to be mounted on a circuit board and having electrical insulation property; and
   a bus bar supported on the support portion and having electrically conductive property, the bus bar including an external connecting portion configured to be electrically connected to an external equipment, a first connecting portion configured to be electrically connected to the circuit board, and a second connecting portion configured to be directly and electrically connected to another circuit board spaced from the circuit board, without passing through the circuit board.

2. The terminal according to claim 1, wherein the second connecting portion extends from the first connecting portion to another circuit board, with a part of the second connecting portion being supported with the support portion.

3. The terminal according to claim 2, wherein the bus bar is formed with a pair of bus bars supported on the support portion, the support portion having a lower surface on which a pair of protrusions is formed to put the pair of bus bars therebetween.

4. The terminal according to claim 3, further comprising a pin disposed between the pair of bus bars to electrically connect the circuit board and another circuit board to each other.

5. The terminal according to claim 4, wherein the bus bar serves to supply electric power to the circuit board and another circuit board, respectively, and the pin serves to exchange signals between the circuit board and another circuit board.

6. The terminal according to claim 1, wherein the bus bar has a lead configured to be connected to a capacitor smoothing fluctuations in electric power.

* * * * *